US012757771B2

(12) United States Patent
Weis et al.

(10) Patent No.: US 12,757,771 B2
(45) Date of Patent: Oct. 6, 2026

(54) IC SUBSTRATE WITH SUPPORT STRUCTURE AND FUNCTIONAL INLAYS THEREIN

(71) Applicant: AT & S Austria Technologie & Systemtechnik Aktiengesellschaft, Leoben (AT)

(72) Inventors: Gerald Weis, Bruck an der Mur (AT); Stefano Sergio Oggioni, Leoben (AT); Markus Leitgeb, Trofaiach (AT); Marco Gavagnin, Leoben (AT)

(73) Assignee: AT & S Austria Technologie & Systemtechnik Aktiengesellschaft, Leoben (AT)

( * ) Notice: Subject to any disclaimer, the term of this patent is extended or adjusted under 35 U.S.C. 154(b) by 359 days.

(21) Appl. No.: 18/696,909

(22) PCT Filed: May 11, 2023

(86) PCT No.: PCT/EP2023/062603

§ 371 (c)(1),
(2) Date: Mar. 28, 2024

(87) PCT Pub. No.: WO2023/217961

PCT Pub. Date: Nov. 16, 2023

(65) Prior Publication Data

US 2025/0038117 A1 Jan. 30, 2025

(30) Foreign Application Priority Data

May 13, 2022 (EP) .................................... 22173273

(51) Int. Cl.
*H05K 1/185* (2026.01)
*H10W 70/05* (2026.01)
(Continued)

(52) U.S. Cl.
CPC ........... *H10W 70/65* (2026.01); *H10W 70/05* (2026.01); *H10W 70/611* (2026.01);
(Continued)

(58) Field of Classification Search
CPC ...... H05K 1/185; H10W 70/65; H10W 90/00; H10W 90/701
See application file for complete search history.

(56) References Cited

U.S. PATENT DOCUMENTS

2005/0183589 A1* 8/2005 Salmon ................ H05K 3/0014 101/3.1
2008/0128885 A1* 6/2008 Lee ..................... H10W 74/012 257/E21.503

(Continued)

FOREIGN PATENT DOCUMENTS

| | | | |
|---|---|---|---|
| CN | 110828321 | A | 2/2020 |
| CN | 110911384 | A | 3/2020 |
| EP | 3657541 | A1 | 5/2020 |

OTHER PUBLICATIONS

"Recent Advances and Trends in Advanced Packaging", IEEE Transactions on Components, Packaging and Manufacturing Technology (dated Jan. 20, 2022).

*Primary Examiner* — Sherman Ng
(74) *Attorney, Agent, or Firm* — CM Law, LLP

(57) ABSTRACT

An integrated circuit substrate for surface mounting an integrated circuit component thereon, wherein the integrated circuit substrate comprises a support structure having at least one hole, and at least two functional inlays placed inside said at least one hole side by side, wherein a pitch at an integrated circuit component mounting side of the integrated circuit substrate is not more than 150 µm.

19 Claims, 4 Drawing Sheets

(51) Int. Cl.
*H10W 70/60* (2026.01)
*H10W 70/65* (2026.01)
*H10W 90/00* (2026.01)
*H10D 1/68* (2025.01)

(52) U.S. Cl.
CPC .............. *H10W 90/00* (2026.01); *H10D 1/68* (2025.01); *H10W 90/794* (2026.01)

(56) References Cited

U.S. PATENT DOCUMENTS

| | | | | |
|---|---|---|---|---|
| 2009/0188703 | A1 | 7/2009 | Ito et al. | |
| 2009/0314519 | A1 | 12/2009 | Soto et al. | |
| 2014/0346678 | A1 * | 11/2014 | DeLaCruz .......... | H10W 70/611 257/774 |
| 2015/0022985 | A1 | 1/2015 | Na et al. | |
| 2020/0105653 | A1 | 4/2020 | Elsherbini et al. | |
| 2020/0105703 | A1 | 4/2020 | Kim et al. | |
| 2020/0176417 | A1 | 6/2020 | Navaja et al. | |

* cited by examiner

IC SUBSTRATE WITH SUPPORT STRUCTURE AND FUNCTIONAL INLAYS THEREIN

This application is a National Phase of International Application No. PCT/EP2023/062603, filed May 11, 2023, which claims the benefit of European Application No. EP 22173273, filed May 13, 2022, both of which are incorporated herein by reference in their entireties.

FIELD OF THE INVENTION

The invention relates to an integrated circuit substrate, to an electronic device, and to a method of manufacturing an integrated circuit substrate.

TECHNOLOGICAL BACKGROUND

In the context of growing product functionalities of component carriers equipped with one or more components and increasing miniaturization of such components as well as a rising number of components to be connected to the component carriers such as printed circuit boards or integrated circuit substrates, increasingly more powerful array-like components or packages having several components are being employed, which have a plurality of contacts or connections, with ever smaller spacing between these contacts. In particular, component carriers shall be mechanically robust and electrically reliable so as to be operable even under harsh conditions.

Conventional approaches of forming component carriers are still challenging in particular what concerns integrated circuit (IC) substrates. In comparison with printed circuit boards, IC substrates are smaller and have a smaller pitch.

SUMMARY OF THE INVENTION

There may be a need to form a compact and reliable IC substrate with flexible and high degree of functionality.

According to an exemplary embodiment of the invention, an integrated circuit substrate for surface mounting an integrated circuit component thereon is provided, wherein the integrated circuit substrate comprises a support structure having at least one hole, and at least two functional inlays placed inside said at least one hole side by side, wherein a pitch at an integrated circuit component mounting side of the integrated circuit substrate is not more than 150 μm (for example not more than 100 μm, in particular not more than 50 μm).

According to another exemplary embodiment of the invention, an electronic device is provided which comprises an integrated circuit substrate having the above-mentioned features.

According to still another exemplary embodiment of the invention, a method of manufacturing an integrated circuit substrate for surface mounting an integrated circuit component thereon is provided, wherein the method comprises providing a support structure with at least one hole, placing at least two functional inlays inside said at least one hole side by side, and forming a pitch at an integrated circuit component mounting side of the integrated circuit substrate being not more than 150 μm.

In the context of the present application, the term "integrated circuit substrate" (IC substrate) may particularly denote a component carrier having a size and a pitch adjusted to the requirements of an integrated circuit component (in particular a semiconductor chip) mounted thereon. An IC substrate may be a, in relation to a PCB, comparably small component carrier onto which one or more integrated circuit components may be mounted and that may act as a connection body between one or more chip(s) and a PCB. For instance, an IC substrate may have substantially the same size as an electronic component to be mounted thereon (for instance in case of a Chip Scale Package (CSP)). In another embodiment, the IC substrate may be larger than the assigned component (for instance in a flip chip ball grid array, FCBGA, configuration). More specifically, an IC substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the IC substrate and can be used to provide electrical, thermal and/or mechanical connections of housed components or unhoused components (such as bare dies), particularly of IC chips, with a printed circuit board or interposer. A dielectric part of an IC substrate may be composed of resin that may comprise reinforcing particles (such as reinforcing spheres, in particular glass spheres) and/or reinforcing fibers (such as glass fibers).

In the context of the present application, the term "hole of a support structure" may particularly denote a through hole extending entirely through the support structure, a blind hole extending from a main surface into the support structure up to a closed bottom at another vertical level than an opposing main surface of the support structure, or an internal cavity inside the support structure spaced with respect to both main surfaces thereof. A support body may have one or a plurality of holes of any of the above-mentioned types or combinations thereof. On one or both opposing main surfaces of the support structure (for instance a core), a laminated layer stack (which may also be denoted as build-up layer(s)) may be formed. The mentioned hole(s) may or may not extend through one or two of said laminated layer stacks.

In the context of the present application, the term "main surface" of a body may particularly denote one of two largest opposing surfaces of the body. The main surfaces may be connected by circumferential side walls. The thickness of a body, such as a stack, may be defined by the distance between the two opposing main surfaces.

In the context of the present application, the term "functional inlay" may particularly denote any physical element or body providing at least one technical function and being configured for being inserted into a hole of the support structure. For instance, a functional inlay may be prefabricated and may then be inserted in a readily manufactured condition into the hole. Although a functional inlay may comprise one or more components, a functional inlay may be different from a component only.

In the context of the present application, the term "placing inlays side-by-side in at least one hole" may particularly denote putting inlays into one or multiple holes at different lateral positions. For example, a single inlay may be inserted per hole. It is also possible that two or more inlays are inserted into a common hole. Adjacent inlays may be placed with mutual lateral direct physical contact to each other, or spaced (for instance spaced by material of the support structure). The arrangement of the functional inlays in the support structure may be along a straight line or in a two-dimensional way (for example in a checker board style or pattern). A placement of inlays side-by-side may be accomplished by arranging the inlays all at the same vertical level. Alternatively, side-by-side placed inlays may be arranged at different vertical levels, however laterally next to each other.

In the context of the present application, the term "pitch", in particular "line pitch", may particularly denote the distance between corresponding edges of two adjacent metal structures. When said metal structures are pads at a main surface of the integrated circuit substrate, the pitch may be the distance between an edge on one side of a first pad and the corresponding edge on one side of a second pad arranged next to said first pad.

In the context of the present application, the term "integrated circuit component mounting side" may particularly denote a main surface of the integrated circuit substrate at which the integrated circuit substrate is to be connected with at least one surface mounted component having a monolithically integrated circuit. Said integrated circuit component mounting side may be arranged at an opposing main surface of the integrated circuit substrate compared with a mounting base mounting side of the integrated circuit substrate on which the integrated circuit substrate is to be mounted on a mounting base, such as a printed circuit board (PCB) or an interposer.

In the context of the present application, the term "electronic device" may particularly denote an arrangement of an integrated circuit substrate with at least one surface mounted integrated circuit component and/or mounted on a mounting base (for example a PCB).

According to an exemplary embodiment of the invention, an IC substrate architecture is provided in which a support structure has embedded functional inlays arranged laterally next to each other and/or spaced with respect to each other. A pitch of not more than 150 μm is a characteristic of an IC substrate in comparison with a PCB having a larger pitch. Advantageously, the support structure (for example a core) may be used in addition to its mechanical support function (and optionally as a redistribution structure) for providing additional functions achieved by embedding functional inlays for providing said functions into one or more holes of the support structure. By taking this measure, a highly flexible and powerful construction set is provided for manufacturing IC substrates with specific application-related or user-defined functional setup. At the same time, such IC substrates may be manufactured with low effort, since simple embedding processes may be sufficient for embedding any desired functional inlay in the IC substrate. Consequently, a multifunctional core with side-by-side located functional inlays may be provided being consequently highly compact in a vertical direction.

DETAILED DESCRIPTION OF EXEMPLARY EMBODIMENTS

In the following, further exemplary embodiments of the IC substrate, the electronic device and the method will be explained.

In an embodiments, one, several or all of the following functions may be implemented in the various functional inlays:

Power Functionality:

Provide capacitances

Embed passive components (such as filter, capacitors, inductors)

Embedding active components (for example a DC-DC converter, a buck converter, a power management integrated circuit)

Security Functionality for tamper-proof configuration:

Embedded Memories

Crypto Engines

VPD (Vital Product Data) storage unit

Embedding of clocks (for example the quartz crystal, oscillator)

Thermal:

copper coin

Thick copper layers

Copper vias with different diameters

Electro-optical Functionalities:

Conversion

Transmission

Connection to an outer optical fiber (for instance for creating a connector)

Optical Communication:

Mirrors

Waveguide

Shielding structures:

Electromagnetic compatibility (EMC)

Security (anti-tamper)

Identification

Current Capabilities/Ampacity:

Different drill diameters within cores

Thick copper layers

In an embodiment, the support structure has a plurality of holes, wherein the at least two functional inlays are placed inside said plurality of holes. By providing a plurality of holes for accommodating the functional inlays and being mutually separated by portions of the support structure, even complex functionality may be integrated in an IC substrate in a compact way.

In an embodiment, the integrated circuit substrate comprises at least three functional inlays inserted in said at least one hole. Thus, even sophisticated electronic functionality may be integrated by three or more functional inlays. Preferably, said at least three functional inlays may be interconnected for functionally cooperating with each other.

In an embodiment, the support structure is a frame structure, in particular a mechanically stable frame structure. Such a frame structure may be easily manufacturable and may provide a highly appropriate basis for inserting functional inlays in any desired configuration. Furthermore, despite of its low weight, a frame structure may provide stability for both the inlays and surface mounted integrated circuit components.

In an embodiment, the support structure is a fully cured core, in particular with through holes. For example, such a core may comprise cured resin (such as epoxy resin), optionally comprising reinforcing particles (such as glass particles, for instance shaped as spheres). In particular, such a core may be made of FR4 material or made of glass. A fully cured core may provide high mechanical stability and may be appropriate for the formation of one or more holes therein. Moreover, such a material may have a very small (if at all) CTE mismatch in relation to material which may form the basis of at least part of the functional inlays. Thus, a homogeneous material distribution of the integrated circuit substrate may be achieved.

In an embodiment, at least one of the functional inlays comprises a metallic slug and/or a laminated layer stack (the latter in particular comprising at least two or even at least four stacked layer structures). Preferably, a respective functional inlay may be significantly different from the support structure, in particular in what concerns function, integration density, etc. An inlay can be, for example, a two layer stack but with different characteristics and/or functionalities than the ones of the main body or support structure. In particular, a functional inlay may be configured as at least four stacked layer structures.

For example, a functional inlay embodied as multilayer stack can provide the technical function of an electric connection structure with locally increased integration density as compared to a lower integration density of a surrounding electric connection structure of another inlay and/or of the support structure. In this context, the term "integration density" may denote a number of electrically conductive elements (in particular trace elements (such as wiring structures), connection elements (such as pads) and/or vertical through connections (such as metallic vias)) per area or volume of the respective portion. Hence, the amount of electrically conductive elements in a higher density portion may be higher than the amount of electrically conductive elements in a lower density portion. Thus, integration density may mean a quantity of electrically conductive elements per area or volume. The integration density in a lower density portion can be less than in a higher density portion.

It is also possible that a functional inlay embodied as multilayer stack provides the function of a redistribution structure. A redistribution structure may function as an electric interface between larger electrically conductive structures, as characteristic for PCB, and smaller electrically conductive structures of a surface mounted component, as characteristic for semiconductor technology.

In an embodiment, it is also possible that a functional inlay comprises a metallic slug, in particular a copper slug. For instance, such a copper slug may provide the technical function of heat removal during operation of the IC substrate or electronic device. This may improve the thermal performance.

In an embodiment, the integrated circuit substrate comprises a laminated layer stack on one main surface of the support structure.

Lamination may denote the process of connecting the layer stack internally and/or to the support structure with its functional inlays by the application of pressure and/or heat. By laminating a layer stack on the upper or lower main surface of the support structure including its embedded functional inlays, further functionality may be added, for instance functionality of a redistribution structure or of a locally increased integration density.

In an embodiment, the integrated circuit substrate comprises a further laminated layer stack on an opposing other main surface of the support structure. In particular, it may be possible that there is only one laminated layer stack on the bottom or that there is only one laminated layer stack on the top of the support structure including functional inlays. In yet another embodiment, there may be a laminated layer stack on the bottom and another laminated layer stack on the top of the support structure including its functional inlays.

In an embodiment, the laminated layer stack and/or the further laminated layer stack has/have a larger integration density than the support structure with the inserted functional inlays. While the functional inlays may provide a specific functionality, the respective laminated layer stack may comprise a fine line structuring for refining the electric connectivity of the IC substrate as a whole. It is however also possible that the integration density of a laminated layer stack may be lower than the integration density of the support structure, for example in a scenario in which an embedded component within the support structure is a bridge or a silicon interposer or another entity with higher integration density.

In an embodiment, a laminated layer stack on the side of the IC substrate at which it is to be mounted on a mounting base (such as a PCB) has a lower integration density than a further laminated layer stack on the integrated circuit component mounting side. In such an advantageous configuration, a laminated layer stack at the integrated circuit component mounting side may be adapted to a finer pitch of one or more surface mounted IC components at the integrated circuit component mounting side. Correspondingly, a further laminated layer stack at a mounting base mounting side may be adapted to a larger pitch of a printed circuit board at the mounting base mounting side. Thus, the laminated layer stacks may contribute to an adjustment or matching between the different characteristic pitches at the two opposing main surfaces of the IC substrate.

In an embodiment, the laminated layer stack (which may be arranged on a bottom side of the IC substrate) has a lower integration density than the further laminated layer stack (which may be arranged on a top side of the IC substrate).

In an embodiment, the integrated circuit substrate comprises a mounting board being connected to the support structure by an electromechanical interconnection layer. For example, the mounting board may function for transmitting electric power and/or signals. The electromechanical interconnection layer may electrically and mechanically couple the mounting board with the functional inlays in the supporting structure. For instance, the electromechanical interconnection layer may have adhesive properties (for instance may comprise at least partially uncured prepreg) for contributing to a mechanical connection between support structure and mounting board. Furthermore, holes may be drilled in said adhesive material and may be filled with an electrically conductive medium for accomplishing and forming an electric z-interconnection (i.e. an interconnection in vertical direction). For example, the vertical interconnection may be accomplished by an electrically conductive paste, nanowires, solder balls, and optionally an underfill.

In an embodiment, upper main surfaces of the functional inlays form part of a top main surface of the integrated circuit substrate and/or lower main surfaces of the functional inlays form part of a bottom main surface of the integrated circuit substrate. In such an embodiment, the embedded functional inlays may extend up to one or even both main surfaces of the IC substrate. Hence, a direct electrical connection between a functional inlay on the one hand and a PCB and/or a surface mounted semiconductor chip on the other hand may be established. This may lead to very short electric paths in vertical direction, and consequently to high signal integrity and low losses as well as low heating.

In an embodiment, at least one of the functional inlays has at least one slanted sidewall. Thus, although the functional inlays may have vertical sidewalls and for example a rectangular cross-section, it is also possible that functional inlays with inclined sidewalls are embedded in the support structure. The concept of embedding functional inlays in a support structure of an IC substrate may offer a high degree of flexibility and is also compatible with slanted inlays.

In an embodiment, in a cross-sectional view showing said at least one slanted sidewall, the functional inlays as a whole form a rectangular (or at least substantially rectangular) structure. Such an embodiment is shown in FIG. 5. The functional inlays may be connected as puzzle pieces for creating an overall rectangular body.

In an embodiment, at least one of the functional inlays has a non-rectangular cross-section. Referring for instance to FIG. 6, the shape of the functional inlays may be freely selected in accordance with functional boundary conditions and/or based on the availability of free empty spaces inside of the support structure which can be used for inlay accommodation purposes. For instance, a shape of a functional inlay in a cross-sectional view may be circular, oval, polygonal with three or at least five corners, for instance trapezoidal or shaped as a parallelogram.

In an embodiment, at least one of the functional inlays is configured to provide a power conversion function, in particular a direct current-direct current (DC-DC)-converter function. Descriptively speaking, a core-integrated DC-DC converter may be provided. Such a power conversion functionality may in particular be achieved by embedding one or more corresponding active components (for instance a DC-DC converter chip) and/or passive components (for example at least one inductor) in the respective functional inlay.

In an embodiment, at least one of the functional inlays is configured to provide a power distribution function, in particular a redistribution structure function. For example, a redistribution layer (RDL) may be integrated in a functional inlay for creating a transfer between larger and smaller pitch. Thus, a functional inlay may provide a power translation or power distribution function. Preferably, a functional inlay providing a power distribution function may extend up to a main surface of the support structure or even of the entire IC substrate facing a mounting base such a PCB. Thus, power conversion may occur spatially close to the mounting base.

In an embodiment, at least one of the functional inlays is configured to provide a power delivery function, in particular provided by a plurality of embedded capacitor components. Embedded passive components embodied as capacitor components may accomplish such a power delivery function.

Preferably, a functional inlay providing a power delivery function may extend up to a main surface of the support structure or even of the entire IC substrate facing a surface mounted semiconductor chip. Thus, power delivery may occur spatially close to the chip(s).

In an embodiment, the integrated circuit substrate comprises at least one security component embedded in at least one of the functional inlays. In the context of the present application, the term “security component” may particularly denote a component providing a security function or contributing to security of the IC substrate or electronic device. Examples of security components are a memory with encryption engine, an anti-tamper structure preventing fraudulent handling, a hardware security module, an oscillator or crystal being protected against clock tampering, etc. By hiding such security components embedded inside of the central support structure, a security attack by a non-authorized entity may be rendered more difficult.

In an embodiment, at least one of the functional inlays comprises at least one heat management structure, in particular for dissipating heat. For instance, such a heat management structure may comprise a heat pipe or a bulky copper block configured for removing heat created during operation of the IC substrate, for instance from one or more surface mounted electronic components.

In an embodiment, at least one of the functional inlays comprises at least one electrooptical structure. For example, such an electrooptical structure may be a waveguide or an electrooptical transducer, such as a photodiode, a semiconductor laser device or any other component with optical functionality. An “optical functionality” may be a functionality involving interaction with electromagnetic radiation, in particular in the visible, ultraviolet and/or infrared range.

In an embodiment, the pitch at the integrated circuit component mounting side is different in regions of different functional inlays. Hence, locally different values of the pitch may be realized at the integrated circuit component mounting side in accordance with the needs of a specific applications. For instance, when a first semiconductor chip with a larger pitch and a second semiconductor chip with a smaller pitch are surface mounted on the IC substrate, the respective pitch on the integrated circuit component mounting side may be adapted correspondingly and may be spatially varying to comply with the pitch requirements of the semiconductor chips. It is also possible that a single surface mounted semiconductor chip has regions of different values of the pitch, which can be complied with by correspondingly spatially varying the pitch at the integrated circuit component mounting side of the IC substrate.

In an embodiment, the pitch at the integrated circuit component mounting side is different from a pitch at a mounting base mounting side. In particular, the pitch at the integrated circuit component mounting side may be smaller (in particular not more than 150 μm, for instance not more than 100 μm) as compared to the pitch (in particular more than 250 μm, for instance more than 400 μm) at the mounting base mounting side of the IC substrate.

In an embodiment, different ones of the at least two functional inlays which are placed side by side extend over different vertical spatial extension. In particular, the technical functions provided by the functional inlays may also be provided not at the same vertical position or in the same vertical region in the core or may be provided over different relative thicknesses. For example, such an embodiment is shown in FIG. 7. Based on the functionality provided by a respective functional inlay, it may be arranged closer to the top side, closer to the bottom side, or may extend over the entire thickness of the support structure or even over the entire thickness of the IC substrate.

In an embodiment, the integrated circuit substrate comprises at least one electrical and/or mechanical connection structure at least on one main surface of a respective one of the functional inlays. For instance, solder balls or an arrangement of dots of solder paste applied directly to the functional inlays may accomplish a connection with surface mounted ICs on the top side and/or a bottom-connected PCB.

In an embodiment, the electronic device comprises at least one integrated circuit component, in particular a semiconductor element, being surface mounted on the integrated circuit component mounting side. For example, such a semiconductor element may be a bare die, an HBM (high-bandwidth memory), or a silicon interposer. A bare die may be a non-encapsulated (in particular non-molded, more particularly non-overmolded) piece of semiconductor material (such as silicon) having at least one monolithically integrated circuit element (such as a diode or a transistor). It is also possible to surface mount a plurality of integrated circuit components on the integrated circuit component mounting side of the integrated circuit substrate.

In an embodiment, the at least one integrated circuit component functionally cooperates with at least one of the functional inlays, in particular with each of the functional inlays. For instance, a bare die may be directly mounted on the IC substrate and may be functionally coupled with at least one of the functional inlays. For instance, a functional inlay may provide a DC-DC conversion between a DC supply voltage provided from a PCB via the IC substrate to a bare die.

In an embodiment, the electronic device comprises a mounting base, in particular a printed circuit board (PCB) or an interposer, on which the integrated circuit substrate is mounted. Such a mounting base may connect the IC substrate and its surface mounted component(s) mechanically and electrically with an electronic periphery, such as a further IC substrate mounted on the same mounting base.

In an embodiment, the integrated circuit substrate has an exposed substrate pad and has an exposed substrate dielectric, the integrated circuit component has an exposed component pad and has an exposed component dielectric, and the integrated circuit substrate is connected with the integrated circuit component so that there is a direct physical contact between the substrate pad and the component pad and so that there is a direct physical contact between the substrate dielectric and the component dielectric.

According to such an embodiment, a package architecture is provided in which a direct physical connection between an integrated circuit substrate and a surface mounted IC-type electronic component is created for establishing an intimate integrally formed connection in between. For this purpose, not only a direct physical connection between exposed pads of electronic component and integrated circuit substrate but also between exposed dielectric surface regions on facing main surfaces of integrated circuit substrate and electronic component may be established by permanent bonding (in particular by hybrid bonding). By such a direct bonding approach, chip assembly on an IC substrate may be significantly simplified over conventional approaches implementing indirect connection techniques such as soldering or sintering. No intermediate material between IC substrate and electronic component may be necessary according to exemplary embodiments of the invention. This contributes to the compactness of the package in vertical direction, since neither solder material nor an interposer needs to be present between IC substrate and IC-type electronic component. Hence, in addition to a simple assembly process, even shorter z-interconnections may be created.

Still referring to the embodiments mentioned in the preceding paragraph, at least one of the following features can be combined with this:

- wherein a connection area between the substrate dielectric and the component dielectric is coplanar with a further connection area between the substrate pad and the component pad.
- wherein the exposed substrate dielectric is formed by a dielectric film, in particular a dielectric oxide film, on a dielectric bulk structure.
- wherein the electronic device is free of any material and/or is free of any gap between the integrated circuit substrate and the electronic component.
- wherein a lateral extension of the substrate pad and/or of the component pad is less than 50 μm, in particular less than 10 μm.
- wherein the component dielectric is formed by a passivation layer of the electronic component or by an additional processed dielectric film on a passivation layer of the electronic component.
- wherein the substrate pad and the component pad are made of the same material.
- wherein the integrated circuit substrate is connected with the electronic component with continuous physical contact over an entire main surface of the electronic component.

In an embodiment, the method comprises pre-fabricating the functional inlays individually before placing the functional inlays inside said at least one hole. Thus, the surface mounted IC(s) may be readily manufactured before being inserted into the support structure.

Preferably, the method comprises testing (in particular electrically or functionally testing) the pre-fabricated functional inlays individually before placing the functional inlays inside said at least one hole. By testing the pre-fabricated functional inlays before assembling them in the one or more holes of the support structure, it may be ensured that only known-good inlays form part of the readily manufactured electronic device, which increases the yield.

In an embodiment, a stack (for instance of the support structure and/or of a laminated layer stack) comprises at least one electrically insulating layer structure and at least one electrically conductive layer structure. For example, the respective stack may be a laminate of the mentioned electrically insulating layer structure(s) and electrically conductive layer structure(s), in particular formed by applying mechanical pressure and/or thermal energy. The mentioned stack may provide a plate-shaped base capable of providing a mounting surface for one or more components and being nevertheless very thin and compact.

In an embodiment, the IC substrate may be shaped as a plate. This contributes to the compact design, wherein the IC substrate nevertheless provides a proper basis for mounting components thereon. Furthermore, in particular a bare die as example for an electronic component, can be conveniently embedded, thanks to its small thickness, into a thin plate-type IC substrate.

The IC substrate may comprise or consist of at least a layer of glass, silicon (Si) and/or a photoimageable or dry-etchable organic material like epoxy-based build-up material (such as epoxy-based build-up film) or polymer compounds (which may or may not include photo- and/or thermosensitive molecules) like polyimide or polybenzoxazole.

In an embodiment, the at least one electrically insulating layer structure comprises at least one of the group consisting of a resin or a polymer, such as epoxy resin, cyanate ester resin, benzocyclobutene resin, bismaleimide-triazine resin, polyphenylene derivate (e.g. based on polyphenylenether, PPE), polyimide (PI), polyamide (PA), liquid crystal polymer (LCP), polytetrafluoroethylene (PTFE) and/or a combination thereof. Reinforcing structures such as webs, fibers, spheres or other kinds of filler particles, for example made of glass (multilayer glass) in order to form a composite, could be used as well. A semi-cured resin in combination with a reinforcing agent, e.g. fibers impregnated with the above-mentioned resins is called prepreg. These prepregs are often named after their properties e.g. FR4 or FR5, which describe their flame retardant properties. Although prepreg particularly FR4 are usually preferred for rigid PCBs, other materials, in particular epoxy-based build-up materials (such as build-up films) or photoimageable dielectric materials, may be used as well. For high frequency applications, high-frequency materials such as polytetrafluoroethylene, liquid crystal polymer and/or cyanate ester resins, may be preferred. Besides these polymers, low temperature cofired ceramics (LTCC) or other low, very low or ultra-low DK materials may be applied in the IC substrate as electrically insulating structures.

In an embodiment, the at least one electrically conductive layer structure comprises at least one of the group consisting of copper, aluminum, nickel, silver, gold, palladium, tungsten, magnesium, carbon, (in particular doped) silicon, titanium, and platinum. Although copper is usually preferred, other materials or coated versions thereof are possible as well, in particular coated with supra-conductive material or conductive polymers, such as graphene or poly(3,4-ethylenedioxythiophene) (PEDOT), respectively.

At least one further component may be embedded in and/or surface mounted on the respective stack. The component and/or the at least one further component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. An inlay can be for instance a metal block, with or without an insulating material coating (IMS-inlay), which could be either embedded or surface mounted for the purpose of facilitating heat dissipation. Suitable materials are defined according to their thermal conductivity, which should be at least 2 W/mK. Such materials are often based, but not limited to metals, metal-oxides and/or ceramics as for instance copper, aluminium oxide ($Al_2O_3$) or aluminum nitride (AlN). In order to increase the heat exchange capacity, other geometries with increased surface area are frequently used as well. Furthermore, a component can be an active electronic component (having at least one p-n-junction implemented), a passive electronic component such as a resistor, an inductance, or capacitor, an electronic chip, a storage device (for instance a DRAM or another data memory), a filter, an integrated circuit (such as field-programmable gate array (FPGA), programmable array logic (PAL), generic array logic (GAL) and complex programmable logic devices (CPLDs)), a signal processing component, a power management component (such as a field-effect transistor (FET), metal-oxide-semiconductor field-effect transistor (MOSFET), complementary metal-oxide-semiconductor (CMOS), junction field-effect transistor (JFET), or insulated-gate field-effect transistor (IGFET), all based on semiconductor materials such as silicon carbide (SiC), gallium arsenide (GaAs), gallium nitride (GaN), gallium oxide ($Ga_2O_3$), indium gallium arsenide (InGaAs), indium phosphide (InP) and/or any other suitable inorganic compound), an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in or surface mounted on the IC substrate. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a IC substrate or an interposer, for example in a board-in-board configuration. The component may be surface mounted on the IC substrate and/or may be embedded in an interior thereof. Moreover, also other components, in particular those which generate and emit electromagnetic radiation and/or are sensitive with regard to electromagnetic radiation propagating from an environment, may be used as component.

In an embodiment, the IC substrate is a laminate. In such an embodiment, the IC substrate is a compound of multiple layer structures which are stacked and connected together by applying a pressing force and/or heat.

After processing interior layer structures of the IC substrate, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or IC substrate.

In particular, an electrically insulating solder resist may be applied to one or both opposing main surfaces of the layer stack or IC substrate in terms of surface treatment. For instance, it is possible to form such a solder resist on an entire main surface and to subsequently pattern the layer of solder resist so as to expose one or more electrically conductive surface portions which shall be used for electrically coupling the IC substrate to an electronic periphery. The surface portions of the IC substrate remaining covered with solder resist may be efficiently protected against oxidation or corrosion, in particular surface portions containing copper.

It is also possible to apply a surface finish selectively to exposed electrically conductive surface portions of the IC substrate in terms of surface treatment. Such a surface finish may be an electrically conductive cover material on exposed electrically conductive layer structures (such as pads, conductive tracks, etc., in particular comprising or consisting of copper) on a surface of a IC substrate. If such exposed electrically conductive layer structures are left unprotected, then the exposed electrically conductive IC substrate material (in particular copper) might oxidize, making the IC substrate less reliable. A surface finish may then be formed for instance as an interface between a surface mounted component and the IC substrate. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), Electroless Nickel Immersion Palladium Immersion Gold (ENIPIG), Electroless Nickel Electroless Palladium Immersion Gold (ENEPIG), gold (in particular hard gold), chemical tin (chemical and electroplated), nickel-gold, nickel-palladium, etc. Also nickel-free materials for a surface finish may be used, in particular for high-speed applications. Examples are ISIG (Immersion Silver Immersion Gold), and EPAG (Eletroless Palladium Autocatalytic Gold).

The aspects defined above and further aspects of the invention are apparent from the examples of embodiment to be described hereinafter and are explained with reference to these examples of embodiment.

BRIEF DESCRIPTION OF THE DRAWINGS

The illustrations in the drawings are schematic. In different drawings, similar or identical elements are provided with the same reference signs.

Figure 1:
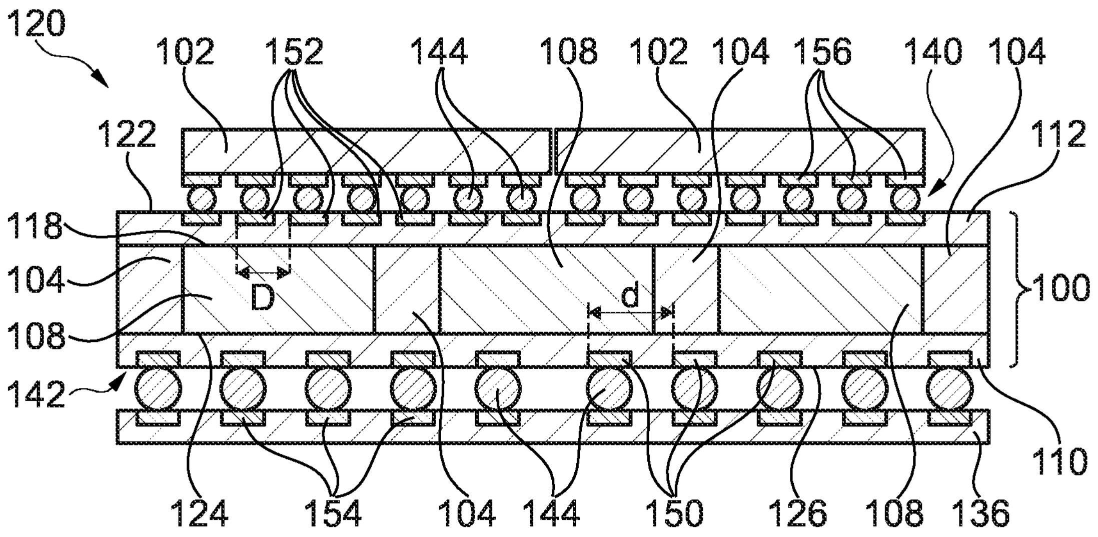
FIG. 1 illustrates a cross-sectional view of an electronic device according to an exemplary embodiment of the invention.

Before, referring to the drawings, exemplary embodiments will be described in further detail, some basic considerations will be summarized based on which exemplary embodiments of the invention have been developed.

According to an exemplary embodiment of the invention, an IC substrate (having a characteristic pitch of not more than 150 μm, preferably less) for surface mounting a bare semiconductor chip is provided. Advantageously, such an IC substrate comprises a (preferably core-type) support structure with embedded functional inlays arranged side by side. Such an architecture may make it possible to obtain an IC substrate with highly compact design in vertical direction which simultaneously provides a sophisticated electronic functionality being flexibly configurable by correspondingly selecting the embedded functional inlays. By embedding inlays in a support structure of the IC substrate, additional functionality may be integrated specifically in those regions where needed for a specific application. Preferably, such functional inlays may be pre-fabricated known-good components allowing to manufacture IC substrate with high yield.

The described approach has advantages: By splitting an IC substrate into separate blocks with specific functions, a functional optimization of the IC substrate volume may be achieved. Such an architecture may be versatile and may allow an efficient material usage and design for individual functional inlays or blocks. By an appropriate frame material choice, warpage may be efficiently suppressed. Application-adapted electrically insulating layer structures may be implemented in the IC substrate, for instance for influencing Young modulus, shrinkage behavior, thermal expansion, etc.

Furthermore, pre-tested and therefore known-good functional inlays may be implemented for achieving a high yield.

According to exemplary embodiments of the invention, any of the functions and sub-functions, alone or in any combination, mentioned in the following may be integrated in any functional inlay of an integrated circuit substrate:

Security function:

Embedding of memory with engines for encryption or for storing sensitive data (such as VPD/keywords/identifier)

Construction of anti-tamper structure to avoid fraudulent handling of the hardware Integration to obtain a Hardware Security Module (HSM)

Embedding of oscillator and/or crystal to avoid tamper of clock functions

Protect all the above with the creation of a sensing network between devices and external accessible layers Thermal management function:

Integration of heat-dissipative structures (for example copper slugs, thermal inlay)

Multiple laser vias construction to increase thermal transfer

Integration of heat-pipe(s) within one of the multi-functional sub-cores (i.e. functional inlays)

Electrical function:

Embedding of capacitances in areas close to a point of load of a microprocessor or an accelerator Embedding of other passive components to create filters Highly effective partitioning of the metal features supporting power domains Fully plated mechanical holes filled with copper for lower resistivity and higher ampacity Power networking distribution of power through thick planes Different copper thicknesses in different sub-cores Different drill diameters in the sub-cores for power feeding structures Flexibility in the wiring of structures (laser vias stacking) not influenced by the positioning of plated through holes Structural function:

Sub-cores can have cavities (for instance for creating resonators, waveguides)

Physical separation of analog circuits from digital circuits

Sub-cores can be made of different dielectric materials (including glass)

Every sub-core can be tested prior of its use in the stacking of the multi-functional core Sub-cores can be constructed so that embedded components are enclosed into a Faraday cage (for instance by cavity plating (for instance in the hole's wall or in the inlay itself), formation of a via fence)

Different copper thicknesses in different sub-cores

Different drill diameters in the sub-cores for power feeding structures

Electrooptical integration function:

Sub-core(s) can be designed to host optical waveguides, mirrors, coupling schemes like adiabatic coupling Sub-core can be designed to host an optical connector to receive or to inject optical signal to and/or from external

DETAILED DESCRIPTION OF ILLUSTRATED EMBODIMENTS

FIG. 1 illustrates a cross-sectional view of an electronic device 120 according to an exemplary embodiment of the invention.

The illustrated electronic device 120 comprises a central integrated circuit substrate 100, also denoted as IC substrate. Furthermore, the electronic device 120 comprises integrated circuit components 102 which are here configured as bare dies (i.e. non-encapsulated semiconductor chips) and which are surface mounted on a top main surface of the IC substrate 100, i.e. at an integrated circuit component mounting side 140 thereof. In the shown embodiment, two IC components 102 are surface mounted on the IC substrate 100. The IC components 102 may be configured as semiconductor chips, for instance active semiconductor chips. Examples of the IC components 102 are processors, memories, sensors, logic chips, microelectromechanical systems (MEMS), etc.

On a bottom side of the electronic device 120, a mounting base 136 is provided on which the IC substrate 100 is mounted. For example, the mounting base 136 may be a printed circuit board (PCB) or an interposer. Although not shown in FIG. 1, further components (such as further IC substrates, further (in particular over-molded) semiconductor chips, etc.) may be assembled on the mounting base 136.

As shown in FIG. 1 as well, electric connection structures 144 may be formed on both opposing main surfaces of the IC substrate 100. For instance, said electric connection structures 144 may be solder balls or solder bumps, or may be configured as sinter structures (for instance may be formed based on sinter paste). The electric connection structures 144 on the bottom main surface of the integrated circuit substrate 100 are connected electrically and mechanically with bottom-sided pads 150 of the IC substrate 100. As shown, a pitch, d, between adjacent bottom-sided pads 150 may be larger than a pitch, D, between adjacent top-sided pads 152 of the IC substrate 100.

Correspondingly, a mutual distance between adjacent electric connection structures 144 is smaller on a top side of the IC substrate 100 than on a bottom side. To put it shortly, the pitch, d, of for example the 250 μm matches with the requirements of PCB technology, whereas the pitch, D, of for example 100 μm matches with the requirements of semiconductor technology. More generally, pitch, D, at the integrated circuit component mounting side 140 of the integrated circuit substrate 100 may be not more than 150 μm, in particular not more than 100 μm. Correspondingly, pitch, d, at mounting base mounting side 142 of the integrated circuit substrate 100 may be more than 200 μm, in particular more than 300 μm. As shown, the bottom-sided pads 150 are electrically coupled with mounting base pads 154 of mounting base 136 by the bottom-sided electric connection structures 144. Correspondingly, the top-sided pads 152 of the IC substrate 100 are electrically coupled with integrated circuit component pads (which may also be denoted as chip pads) 156 of the IC components 102 by the top-sided electric connection structures 144.

In the following, construction of the IC substrate 100 will be explained in further detail:

As shown in FIG. 1, the integrated circuit substrate 100 comprises a support structure 104 having a plurality of through holes. The support structure 104 serves as a mechanically stable frame structure for mechanically supporting the surface mounted integrated circuit components 102 and for accommodating functional inlays 108. For example, the support structure 104 may be a fully cured core made of FR4 material, optionally with embedded electrically conductive structures therein. Such embedded electrically conductive structures may be, for example, copper filled drill holes, patterned copper layers, etc. Holes for accommodating functional inlays 108 may be formed in the support structure 104 for example by mechanically cutting, by laser processing, by etching or by routing.

Figure 8:
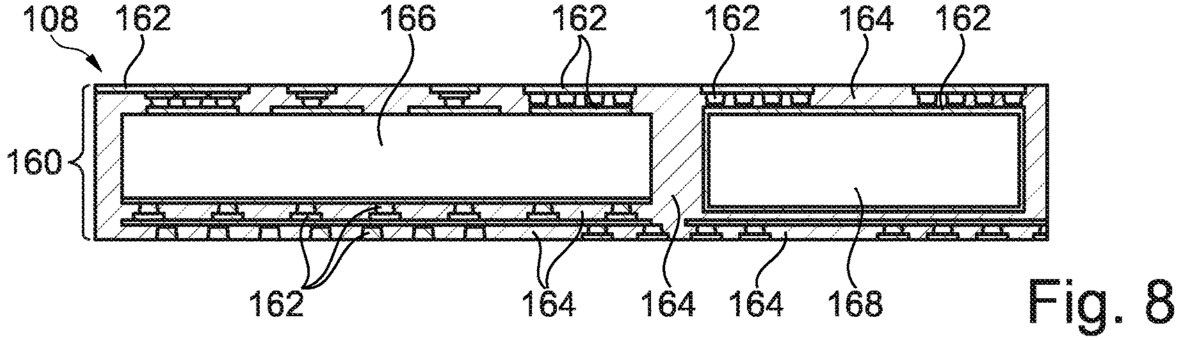
FIG. 8 to FIG. 10 illustrate cross-sectional views of functional inlays for an IC substrate according to exemplary embodiments of the invention.
Figure 9:
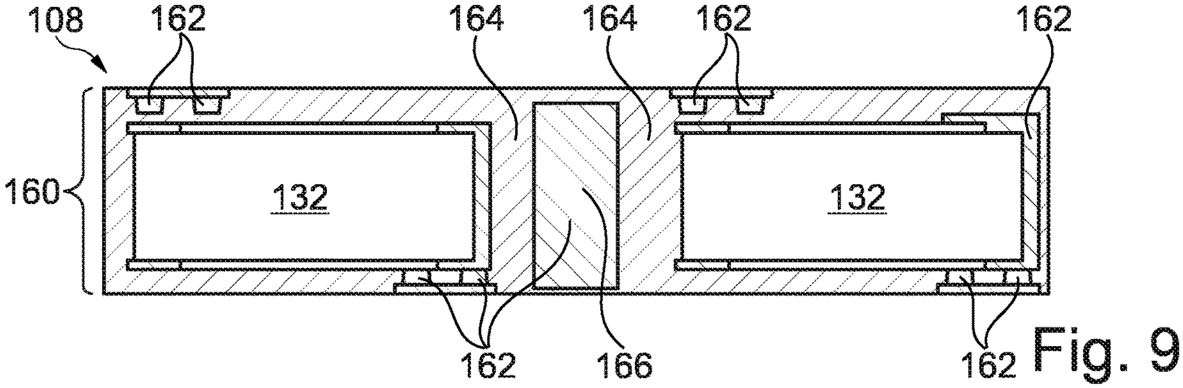
Figure 10:
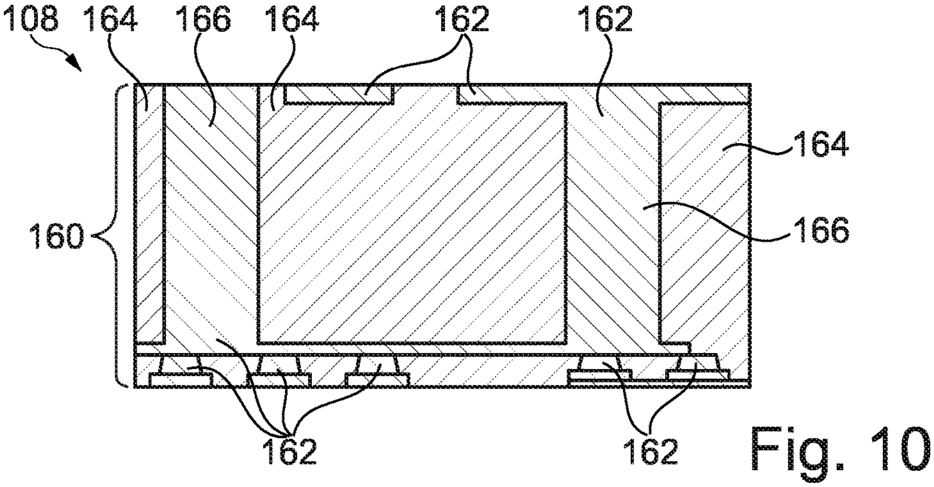

In the embodiment of FIG. 1, three pre-fabricated functional inlays 108 are placed inside said holes side by side, i.e. sideways or laterally with respect to each other. Each functional inlay 108 may provide a dedicated function, and functions provided by different functional inlays 108 may be different. It is also possible that only two inlays 108 or at least four inlays 108 are provided. In the shown embodiment, one functional inlay 108 per hole is provided. Alternatively, two or more functional inlays 108 may be inserted per hole. It is also possible that a larger or smaller number of holes is provided. It is also possible that blind holes or recesses or cavities are provided additionally or alternatively to through holes. FIG. 1 does not show the detailed construction of the functional inlays 108. However, examples for functional inlays 108 which may be pre-fabricated and may then be inserted into the frame-type support structure 108 are illustrated in FIG. 8 to FIG. 10.

Preferably, the functional inlays 108 may be configured so that the surface mounted integrated circuit components 102 functionally cooperate with the functional inlays 108. For instance, the functional inlays 108 may provide additional functionality in terms of power conversion, power distribution, power delivery, etc.

As shown in FIG. 1 as well, the IC substrate 100 comprises a laminated layer stack 110 on a bottom main surface of the support structure 104 and of the functional inlays 108. Furthermore, a further laminated layer stack 112 may be formed on an opposing other main surface of the support structure 104 and of the functional inlays 108. Hence, a further build-up may be formed on one or both opposing main surfaces of the support structure 104 with embedded functional inlays 108. Any of the laminated layer stacks 110, 112 may comprise one or more electrically conductive layer structures (such as patterned copper foils which may form horizontal pads and/or a horizontal wiring structure, and/or vertical through connections such as copper pillars and/or copper filled laser vias) and one or more electrically insulating layer structures (such as prepreg or resin sheets). For example, the laminated layer stack 110 and/or the further laminated layer stack 112 may have a larger integration density than the support structure 104 with the inserted functional inlays 108. Advantageously, it is also possible that the bottom-sided laminated layer stack 110 has a lower integration density than the top-sided further laminated layer stack 112. Hence, a locally higher integration density may be formed next to the surface mounted IC components 102 having a higher integration density as well. However, a lower integration density may be sufficient next to the mounting base 136 with its lower integration density characteristic for PCB-technology. This may allow to manufacture the support structure 104 with low effort and to provide one or more regions of higher integration density only when needed. For instance, any of the optional layer stacks 110, 112 may contribute to a mechanical strengthening and/or the formation of a redistribution layer in the framework of the electronic device 120.

Again referring to FIG. 1, instead of providing a monolithic substrate, the shown embodiment uses sublets or sub-segments in form of the functional inlays 108 which are inserted into the main body of the integrated circuit substrate 100 and each providing a different functionality. Preferably, the functional inlays 108 comprise organic laminate material (see for instance FIG. 8 to FIG. 10) rather than being a semiconductor chip only. However, a functional inlay 108 may nevertheless comprise one or more embedded components (such as semiconductor chips) in addition to organic laminate material (see for instance FIG. 9 or FIG. 10).

It should be mentioned that the solder balls connecting the IC substrate 100 and the IC components 102 may be smaller than the solder balls connecting the IC substrate 100 with the mounting base 136.

Figure 2:
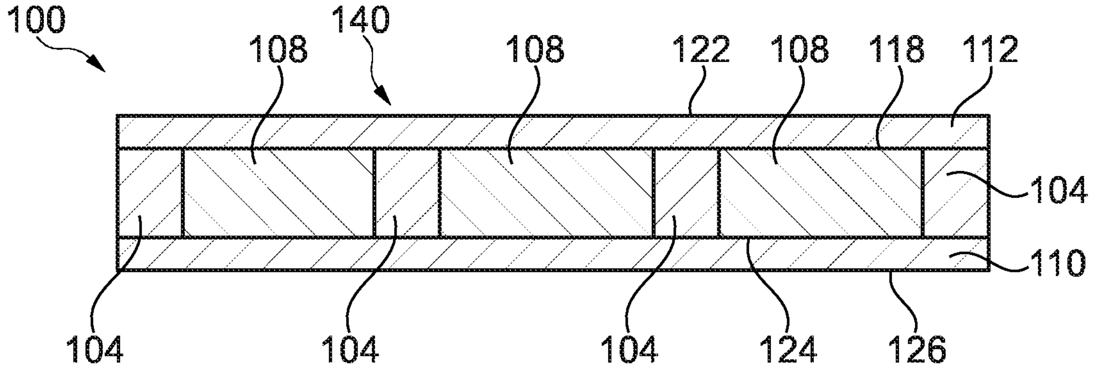
FIG. 2 illustrates a cross-sectional view of an IC substrate according to an exemplary embodiment of the invention.

FIG. 2 illustrates a cross-sectional view of an IC substrate 100 according to an exemplary embodiment of the invention.

To put it shortly, FIG. 2 illustrates IC substrate 100 of FIG. 1 without IC components 102 and without mounting base 136.

Referring to FIG. 2, possible functions which may be implemented in any of the functional inlays 108 may be in particular the following:

signal routing (in particular for high-speed applications)

power delivery (in particular by multilayer structures, embedded passive components, etc.)

thermal functionality (for instance by heat-removing copper slugs)

an electro-optical transducing function (In such a transducer, there may be several components. As a signal may be digital but light may be actually analog, an analog/digital converter and a digital/analog converter may be implemented. Furthermore, a digital signal processor may be implemented to distribute the data into different signal lanes. All these functions can be integrated in one IC component or in different IC components. Furthermore, photodiodes may translate optical signals into electrical ones, but optical signals may be generated by a laser or an external light source. Modulation of such a light may also be possible, which may be done with driver IC components controlling the laser itself or modulators on a photonic IC.)

formation of an organic or silicon bridge (for instance for fine line structures)

antenna or other high-frequency functions

Figure 3:
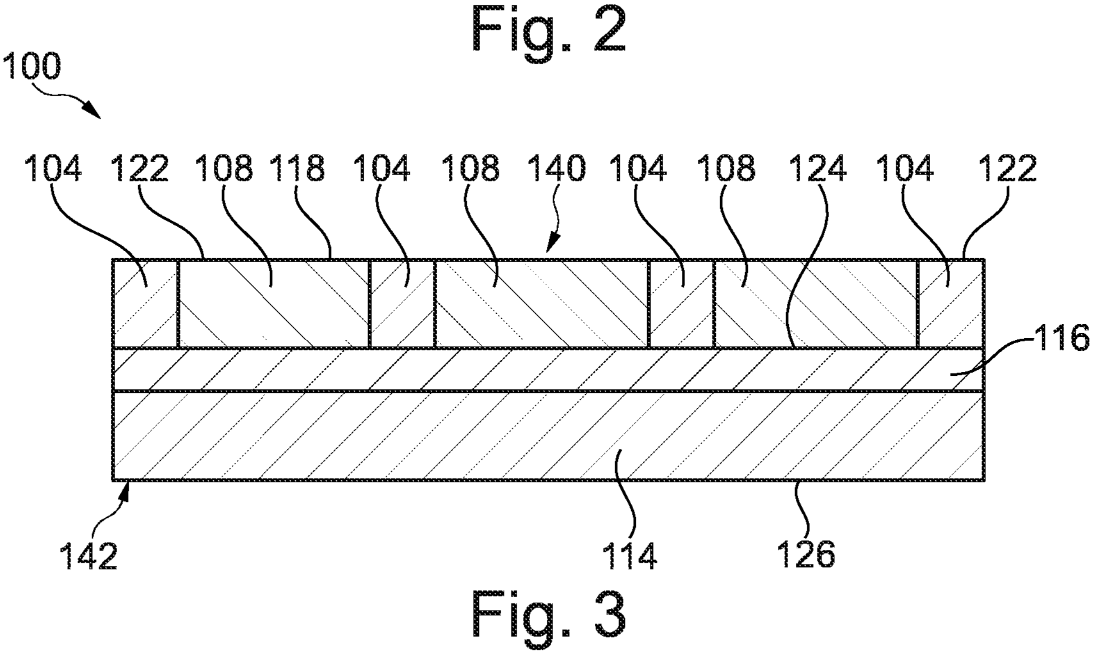
FIG. 3 illustrates a cross-sectional view of an IC substrate according to another exemplary embodiment of the invention.

FIG. 3 illustrates a cross-sectional view of an IC substrate 100 according to another exemplary embodiment of the invention.

The embodiment of FIG. 3 differs from the embodiment of FIG. 2 in particular in that, in the embodiment of FIG. 3, the laminated layer stacks 110, 112 are omitted. Furthermore, IC substrate 100 according to FIG. 3 comprises a mounting board 114 connected to the support structure 104 by an electromechanical interconnection layer 116. For instance, the electromechanical interconnection layer 116 has adhesive properties (for instance initially comprises uncured sticky prepreg or resin sheet) for mechanically interconnecting the mounting board 114 with the functional inlays 108 and with the support structure 104. Although not shown in FIG. 3, the electromechanical interconnection layer 116 can be provided with drilled holes filled with electrically conductive material (such as an electrically conductive paste, nanowires, solder material, plated copper, etc.). For instance, mounting board 114 may be an organic board, such as a piece of PCB. Mounting board 114 can for instance provide a power and/or signal supply function.

Due to the omission of laminated layer stack 112 in FIG. 3, upper main surfaces 118 of the functional inlays 108 as well as upper main surfaces of support structure 104 form part of a top main surface 122 of the integrated circuit substrate 100.

Figure 7:
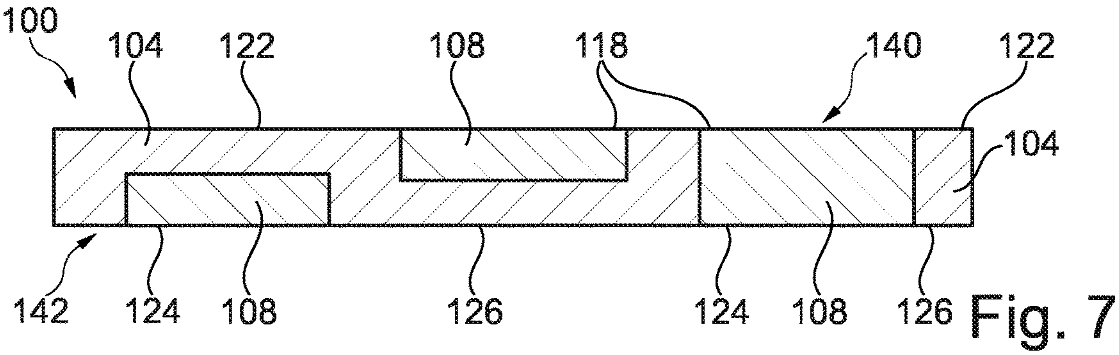
FIG. 7 illustrates a cross-sectional view of an IC substrate according to another exemplary embodiment of the invention.

While the functional inlays 108 are coplanar according to FIG. 3, they can also be arranged at different vertical levels, as shown for instance in FIG. 7.

Figure 4:
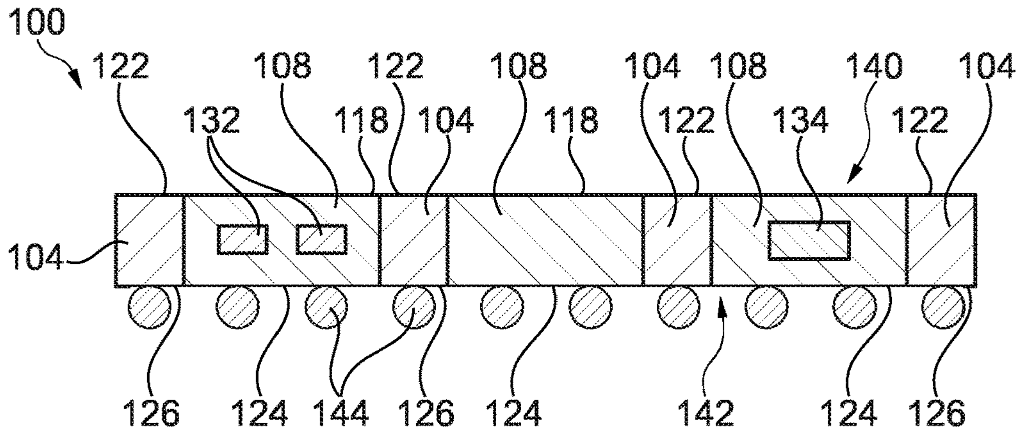
FIG. 4 illustrates a cross-sectional view of an IC substrate according to another exemplary embodiment of the invention.

FIG. 4 illustrates a cross-sectional view of an IC substrate 100 according to another exemplary embodiment of the invention.

The embodiment of FIG. 4 differs from the embodiment of FIG. 2 in particular in that, in the embodiment of FIG. 4, the laminated layer stacks 110, 112 are omitted. As a result, upper main surfaces 118 of the functional inlays 108 as well as upper main surfaces of support structure 104 form part of top main surface 122 of the integrated circuit substrate 100, and lower main surfaces 124 of the functional inlays 108 as well as lower main surfaces of the support structure 104 form part of a bottom main surface 126 of the integrated circuit substrate 100. Electrical and/or mechanical connection structures 144, which are here embodied as solder balls, are formed on the bottom main surface of both the functional inlays 108 and the support structure 104 for accomplishing a mechanical and electrical connection to a mounting base 136 (not shown in FIG. 4). According to FIG. 4, the frame-type support structure 104 just holds the functional inlays 108 together without the necessity of build-up layers. The solder balls on the frame help stabilizing the IC substrate 100.

In all embodiments, the functional inlays 108 may be connected to the support structure 104 by a connection medium, such as a glue or a resin from a laminate.

As shown as well in FIG. 4, one or more security components 134 may be embedded in one or more of the functional inlays 108. For instance, the illustrated security component 134 may be a crypto engine, an anti-tamper structure, or a clock generator protected against tampering, etc. By embedding security component 134 in an interior of the integrated circuit substrate 100, a security attack by an unauthorized entity may be made more difficult since it would require access to embedded security component 134, which is difficult without destroying IC substrate 100.

Furthermore, embedded capacitor components 132 in another functional inlay 108 may provide a power delivery function inside IC substrate 100.

Figure 5:
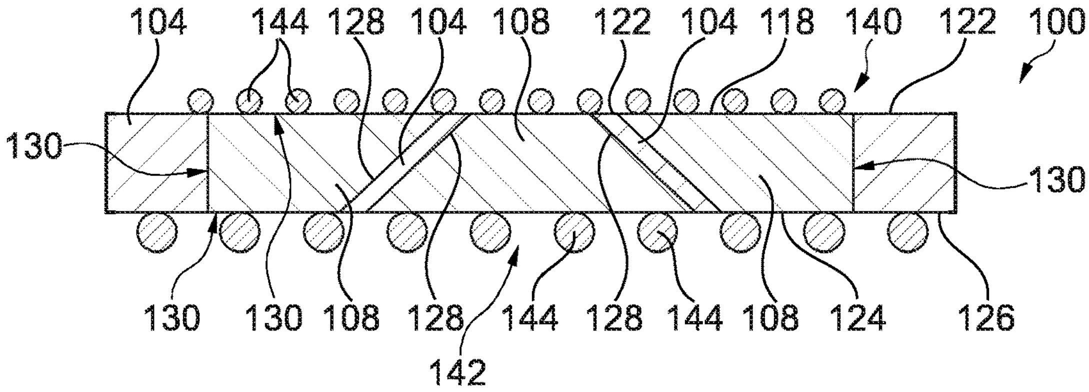
FIG. 5 illustrates a cross-sectional view of an IC substrate according to another exemplary embodiment of the invention.

FIG. 5 illustrates a cross-sectional view of an IC substrate 100 according to another exemplary embodiment of the invention.

The embodiment of FIG. 5 differs from the embodiment of FIG. 4 in particular in that, in the embodiment of FIG. 5, the functional inlays 108 have slanted (rather than vertical) sidewalls 128. In the illustrated cross-sectional view of FIG. 5, the functional inlays 108 with slanted sidewalls 128 are grouped so as to form together a rectangular structure 130. The design of FIG. 5 with functional inlays 108 having sloped sidewalls 128 may allow to use the volume within the integrated circuit body highly efficiently by allocating different functionalities only to regions where they are needed.

Figure 6:
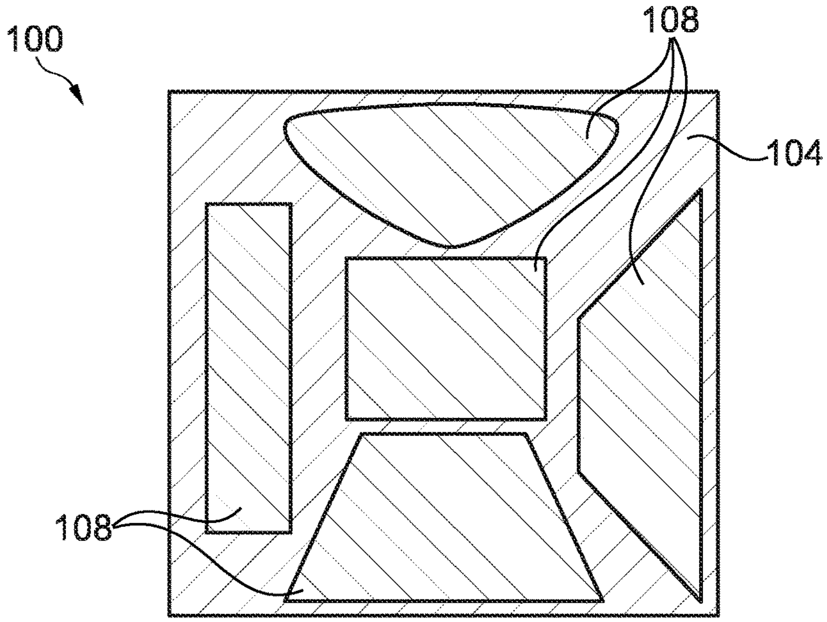
FIG. 6 illustrates a plan view of an IC substrate according to another exemplary embodiment of the invention.

FIG. 6 illustrates a plan view of an IC substrate 100 according to another exemplary embodiment of the invention.

According to FIG. 6, some of the functional inlays 108 have a non-rectangular cross-section. Hence, the shape of the functional inlays 108 is not limited to regular geometric forms like squares and rectangles. In contrast to this, it is also possible to freely form the functional inlays 108 to match with their intended function.

FIG. 7 illustrates a cross-sectional view of an IC substrate 100 according to another exemplary embodiment of the invention.

The embodiment of FIG. 7 differs from the embodiment of FIG. 4 in particular in that, in the embodiment of FIG. 7, different ones of the functional inlays 108 which are placed side by side extend over different vertical spatial extensions or ranges.

The functional inlay 108 on the right-hand side of FIG. 7, for instance, extends over the entire thickness of the support structure 104 by being inserted in a through hole of the support structure 104 extending between both its opposing main surfaces. For example, said inlay 108 may provide a function which is needed over the entire vertical extension of the support structure 104.

The functional inlay 108 on the left-hand side of FIG. 7, for instance, is inserted in a blind hole formed in a bottom main surface of support structure 104 and extends over only part of the thickness of the support structure 104 from its bottom main surface into an interior of the support structure 104. For example, said inlay 108 may provide a function which is needed only in the lower portion of the support structure 104.

The functional inlay 108 in the middle of FIG. 7, for instance, is inserted in a blind hole formed in a top main surface of support structure 104 and extends over only part of the thickness of the support structure 104 from its top main surface into an interior of the support structure 104. For example, said inlay 108 may provide a function which is needed only in the upper portion of the support structure 104.

FIG. 8 to FIG. 10 illustrate cross-sectional views of functional inlays 108 for an IC substrate 100 according to exemplary embodiments of the invention.

Referring to FIG. 8, a functional inlay 108 is shown which may be embodied as laminated layer stack, for instance in form of a piece of a further IC substrate or a piece of a printed circuit board (PCB). More specifically, the functional inlay 108 may comprise a stack 160 comprising electrically conductive layer structures 162 and electrically insulating layer structures 164. The electrically conductive layer structures 162 may comprise patterned metal layers (such as patterned copper foils or patterned deposited copper layers) and vertical through connections, for example copper filled vias which may be created by drilling and plating. The electrically insulating layer structures 164 may comprise a respective resin (such as a respective epoxy resin), preferably comprising reinforcing particles therein (for instance glass spheres). For instance, the electrically insulating layer structures 164 may be made of FR4. The electrically insulating layer structures 164 may also comprise resin layers being free of glass particles.

Moreover, the functional inlay 108 according to FIG. 8 comprises embedded components, here embodied as an active component 166 and a passive component 168. For instance, active component 166 may be a DC-DC-converter chip, whereas passive component 168 may be an inductor component. Together, components 166, 168 embedded in the functional inlay 108 may provide a power conversion function, more specifically a direct current-direct current-converter function. To put it shortly, the shown configuration may provide a core-integrated DC-DC-converter.

Referring to FIG. 9, the illustrated functional inlay 108 is configured to provide a power delivery function provided by a plurality of capacitor components 132 embedded in laminated layer stack 160. Descriptively speaking, the embedded capacitor components 132 may provide a power delivery function at a highly appropriate position inside of stack 160 (in particular more appropriate than in a surface mounted manner, as in conventional approaches).

Moreover and still referring to FIG. 9, the functional inlays 108 comprise a metallic slug 166 or a pillar (preferably made of copper). The metallic slug 166 is made of highly thermally conductive material and may therefore contribute to an efficient removal of heat out of the IC substrate 100 during operation. In FIG. 9, the metallic slug 166 is totally embedded inside of the IC substrate 100. However, it is also possible that the metallic slug 166 is exposed at the top side and/or the bottom side of the IC substrate 100. This may further improve heat management. In one configuration, the metallic slug 166 may also be used for conducting electric current.

Referring to FIG. 10, a functional inlay 108 is shown which is configured to provide a power distribution function. The distributed arrangement of electrically conductive layer structures 162 may distribute electric power over an electronic device 120 in a predefined and efficient way. Moreover, also the embodiment of FIG. 10 comprises metallic slugs 166 for improving the thermal performance.

Figure 11:
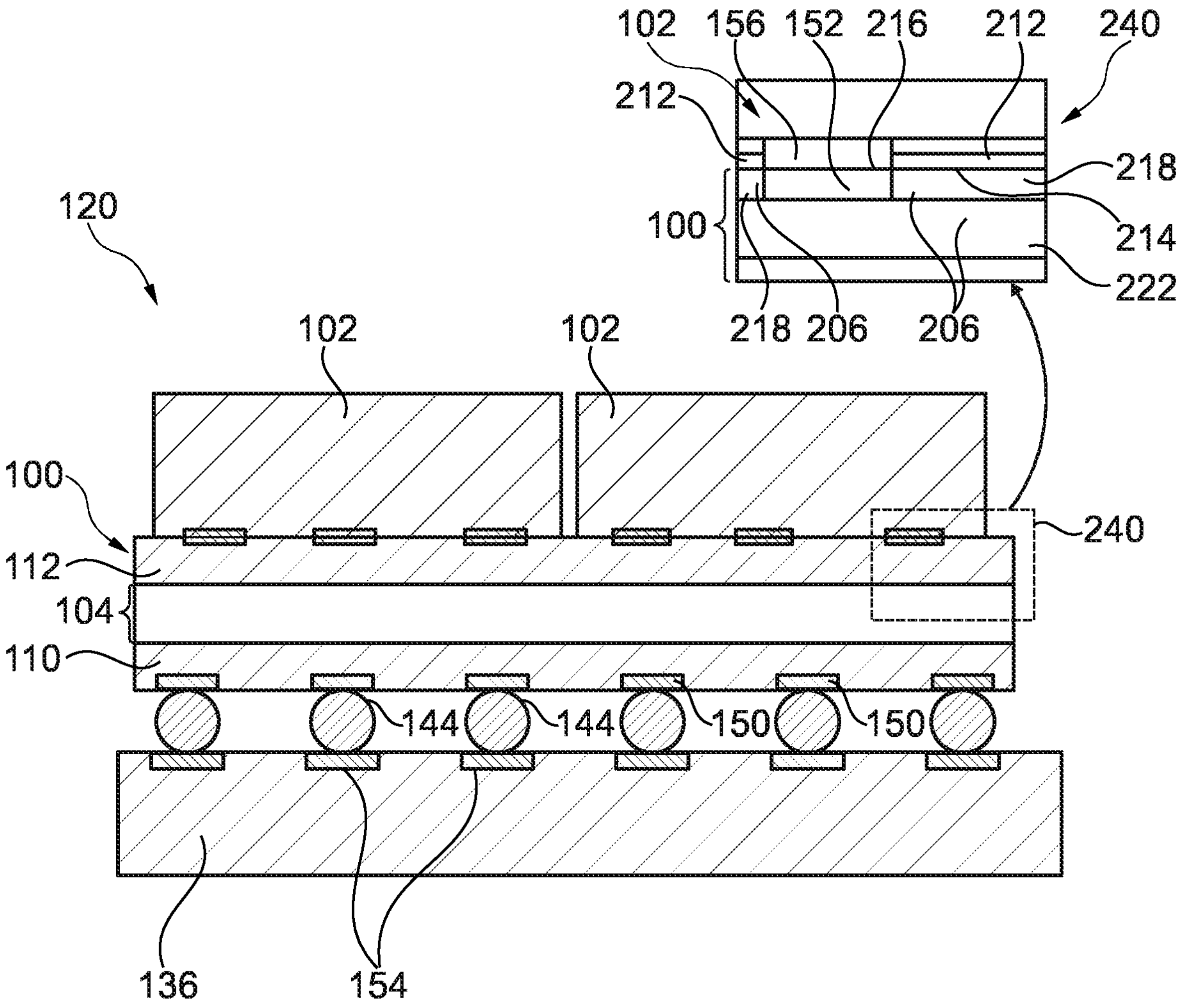
FIG. 11 illustrates a cross-sectional view of an electronic device according to another exemplary embodiment of the invention.

FIG. 11 illustrates a cross-sectional view of an electronic device 120 according to another exemplary embodiment of the invention.

The illustrated electronic device 120 comprises an integrated circuit substrate 100 and comprises two electronic components 102 mounted with full-surface direct physical contact on the integrated circuit substrate 100.

On a bottom side of the electronic device 120, a mounting base 136 is provided on which the IC substrate 100 is mounted.

The integrated circuit substrate 100, the at least one electronic component 102 and/or the mounting base 136 can be constructed according to any of the above described figures.

A detail 240 in FIG. 11 shows particularities of the connection surface between the integrated circuit substrate 100 and one of the electronic components 102. As shown in detail 240, the electronic device 120 is free of any material and is free of any gap between the integrated circuit substrate 100 and the electronic component 102 which are connected with each other over a continuous connection area. Thus, the integrated circuit substrate 100 may be connected with the electronic components 102 with continuous physical contact over an entire main surface of the electronic components 102.

Still referring to FIG. 11 and in particular to detail 240, the integrated circuit substrate 100 comprises in its upper portion a plurality of exposed integrated circuit substrate pads 152 being surrounded by an exposed substrate dielectric 206. For instance, each of the substrate pads 152 is made of copper material. The exposed substrate dielectric 206 may for instance be organic dielectric material, such as epoxy resin. In the connected state according to FIG. 11, exterior planar surface portions of the exposed substrate dielectric 206 and of the exposed substrate pads 152 may be coplanar and at the same vertical level. The avoidance of protrusions and depressions in the substantially flat connection surface between integrated circuit substrate 100 and electronic components 102 may ensure a reliable electric connection as well as an avoidance of cracks.

Still referring to detail 240, the illustrated electronic component 102 has exposed component pads 156 and has an exposed component dielectric 212. For instance, each of the component pads 156 is made of copper material. Advantageously, the material of the substrate pads 152 and of the component pads 156 may be the same which may promote a firm pad-pad connection and thus a good reliability of electronic device 120. The exposed component dielectric 212 may for instance be a passivation layer made of a polymer dielectric material.

In the connected state according to FIG. 11, exterior planar surface portions of the exposed component dielectric 212 and of the exposed component pads 156 may be coplanar, i.e. at the same vertical level. Furthermore, exterior planar surface portions of the exposed component pads 156 and of the exposed substrate pads 152 may be coplanar and at the same vertical level as dielectrics 206, 212. Hence, a connection area 214 between the substrate dielectric 206 and the component dielectric 212 is coplanar with a further connection area 216 between the substrate pad 152 and the component pad 156.

As shown in detail 240 as well, the integrated circuit substrate 100 is connected with the illustrated electronic component 102 so that there is a direct physical contact between the substrate pads 152 and the component pads 156. Furthermore, the connection is executed so that there is a direct physical contact between the substrate dielectric 206 and the component dielectric 212. Advantageously, no additional material (such as solder) or element (for instance an interposer) is arranged between the integrated circuit substrate 100 and the electronic components 102. This keeps the vertical dimension of electronic device 120 small so that a compact design may be achieved. Furthermore, this direct connection keeps the electric connection paths short, thereby ensuring high signal integrity and low losses as well as a strong suppression of excessive electronic device heating. Consequently, electronic device 120 may be provided with high thermal, mechanical and electrical reliability.

In the illustrated embodiment, the exposed substrate dielectric 206 can be formed by a thin dielectric film 218, which can be preferably a dielectric oxide film formed by oxidizing a dielectric surface portion of the integrated circuit substrate 100. The thin dielectric film 218 may be arranged on a thick dielectric bulk structure 222 of the integrated circuit substrate 100. By forming the exposed substrate dielectric 206 with a very smooth thin dielectric film 218, excellent adhesion properties between integrated circuit substrate 100 and the respective IC-type electronic component 102 may be achieved.

As shown, the bottom-sided pads 150 are electrically coupled with mounting base pads 154 of mounting base 136 by bottom-sided electric connections structures 144 (such as solder balls). In contrast to this, the top-sided substrate pads 152 are directly electrically coupled with the component pads 156 of the IC components 102, i.e. without top-sided electric connections structures (i.e. without solder balls or the like).

It should be noted that the term "comprising" does not exclude other elements or steps and the "a" or "an" does not exclude a plurality. Also, elements described in association with different embodiments may be combined.

It should also be noted that reference signs in the claims shall not be construed as limiting the scope of the claims.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. An integrated circuit substrate for surface mounting an integrated circuit component thereon, wherein the integrated circuit substrate comprises: a support structure having at least one hole; and at least two functional inlays placed inside said at least one hole side by side; wherein a pitch at an integrated circuit component mounting side of the integrated circuit substrate is not more than 150 μm, and wherein the pitch at the integrated circuit component mounting side is different in regions of different functional inlays.

2. The integrated circuit substrate according to claim 1, wherein the support structure has a plurality of holes, and wherein the at least two functional inlays are placed inside said plurality of holes.

3. The integrated circuit substrate according to claim 1, wherein the support structure is a frame structure.

4. The integrated circuit substrate according to claim 1, comprising a mounting board being connected to the support structure by an electromechanical interconnection layer.

5. The integrated circuit substrate according to claim 1, wherein upper main surfaces of the functional inlays form part of a top main surface of the integrated circuit substrate and/or lower main surfaces of the functional inlays form part of a bottom main surface of the integrated circuit substrate.

6. The integrated circuit substrate according to claim 1, wherein at least one of the functional inlays has at least one slanted sidewall.

7. The integrated circuit substrate according to claim 1, wherein at least one of the functional inlays has a non-rectangular cross-section.

8. The integrated circuit substrate according to claim 1, wherein at least one of the functional inlays is configured to provide a power conversion function, in particular a direct current-to-direct current (DC to DC) converter function.

9. The integrated circuit substrate according to claim 1, wherein the pitch at the integrated circuit component mounting side is different from a pitch at a mounting base mounting side.

10. The integrated circuit substrate according to claim 1, comprising at least one electrical and/or mechanical connection structure at least on one main surface of a respective one of the functional inlays.

11. An electronic device, which comprises an integrated circuit substrate according to claim 1.

12. The electronic device according to claim 11, comprising at least one integrated circuit component, in particular a semiconductor element, being surface mounted on the integrated circuit component mounting side.

13. The electronic device according to claim 11, comprising a mounting base, in particular a printed circuit board or an interposer, on which the integrated circuit substrate is mounted.

14. The electronic device according to claim 12, wherein the integrated circuit substrate has an exposed substrate pad and has an exposed substrate dielectric; the integrated circuit component has an exposed component pad and has an exposed component dielectric; and the integrated circuit substrate is connected with the integrated circuit component so that there is a direct physical contact between the substrate pad and the component pad and so that there is a direct physical contact between the substrate dielectric and the component dielectric.

15. The integrated circuit substrate according to claim 1, wherein at least one of the functional inlays is configured to provide a power distribution function, in particular a redistribution structure function.

16. The integrated circuit substrate according to claim 1, wherein at least one of the functional inlays is configured to provide a power delivery function.

17. The integrated circuit substrate according to claim 16, wherein the power delivery function is provided by a plurality of embedded capacitor components.

18. The integrated circuit substrate according to claim 1, further comprising at least one security component embedded in at least one of the functional inlays.

19. A method of manufacturing an integrated circuit substrate for surface mounting an integrated circuit component thereon, wherein the method comprises: providing a support structure with at least one hole; placing at least two functional inlays inside said at least one hole side by side; and forming a pitch at an integrated circuit component mounting side of the integrated circuit substrate being not more than 150 μm, wherein the pitch at the integrated circuit component mounting side is different in regions of different functional inlays.

* * * * *